United States Patent
Winer et al.

(10) Patent No.: US 7,446,382 B2
(45) Date of Patent: Nov. 4, 2008

(54) METHOD AND APPARATUS FOR FABRICATION OF PASSIVATED MICROFLUIDIC STRUCTURES IN SEMICONDUCTOR SUBSTRATES

(75) Inventors: Paul Winer, Santa Clara, CA (US); George P. Vakanas, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/976,928

(22) Filed: Oct. 28, 2004

(65) Prior Publication Data

US 2005/0090034 A1    Apr. 28, 2005

Related U.S. Application Data

(62) Division of application No. 09/895,127, filed on Jun. 29, 2001, now Pat. No. 6,878,567.

(51) Int. Cl.
*H01L 27/14*    (2006.01)
*H01L 29/82*    (2006.01)

(52) U.S. Cl. .................... 257/414; 257/499
(58) Field of Classification Search ............. 257/414, 257/E29.324, 499; 216/79; 438/53
See application file for complete search history.

(56) References Cited

U.S. PATENT DOCUMENTS

| | | | | |
|---|---|---|---|---|
| 5,232,749 A | * | 8/1993 | Gilton | .......... 427/558 |
| 5,389,196 A | * | 2/1995 | Bloomstein et al. | ........... 216/66 |
| 5,427,975 A | * | 6/1995 | Sparks et al. | ............... 438/79 |
| 5,719,073 A | * | 2/1998 | Shaw et al. | .................. 438/53 |
| 5,736,430 A | * | 4/1998 | Seefeldt et al. | ............... 438/53 |
| 5,740,594 A | * | 4/1998 | Lukasiewicz et al. | ...... 29/25.41 |
| 5,834,333 A | * | 11/1998 | Seefeldt et al. | ............... 438/52 |
| 5,969,591 A | * | 10/1999 | Fung | ........................... 338/42 |
| 5,992,769 A | * | 11/1999 | Wise et al. | ................... 239/548 |
| 6,019,882 A | * | 2/2000 | Paul et al. | .................... 204/450 |
| 6,051,866 A | * | 4/2000 | Shaw et al. | ................. 257/417 |
| 6,180,536 B1 | * | 1/2001 | Chong et al. | ................ 438/745 |
| 6,569,702 B2 | * | 5/2003 | Cho et al. | ..................... 438/50 |

OTHER PUBLICATIONS

T.M. Bloomstein et al. "Laser deposition and etching of three-dimensional microstructure", May 1991, IEEE, pp. 507-511.*

* cited by examiner

*Primary Examiner*—Monica Lewis
(74) *Attorney, Agent, or Firm*—Darby & Darby PC

(57) ABSTRACT

A method and apparatus for fabrication of passivated microfluidic structures is disclosed. The method includes providing a substrate having a microfluidic structure formed therein. The microfluidic structure is embedded by an embedding layer. The method further includes passivating the embedded microfluidic structure by locally heating the microfluidic structure surface in a reactive atmosphere, wherein the passivated microfluidic structure is suitable for transporting a fluid. The structure optionally further includes metal pads to form an electrokinetic pump.

20 Claims, 3 Drawing Sheets

METHOD AND APPARATUS FOR FABRICATION OF PASSIVATED MICROFLUIDIC STRUCTURES IN SEMICONDUCTOR SUBSTRATES

CROSS REFERENCE TO RELATED APPLICATIONS

This application is a divisional application of U.S. application Ser. No. 09/895,127 filed Jun. 29, 2001, now U.S. Pat. No. 6,878,567 issued Apr. 12, 2005. The disclosure of the prior application is considered part of and is incorporated by reference in the disclosure of this application.

BACKGROUND

1. Field of the Invention

This invention relates to microfluidic structures. More specifically, it relates to passivating exposed walls of embedded microfluidic structures.

2. Background

Micro electro mechanical systems (MEMS) combine electrical and mechanical functionalities on a single substrate. An example of a MEMS device could be a small mechanical chamber where two liquids (biofluids, drugs, chemicals etc.) are mixed and a sensor interprets the results. MEMS could also be integrated with logic functionalities having a CMOS circuit to perform some algorithm with the data provided by the sensor. The CMOS circuit could then have circuit elements that transport the results of the algorithm and the sensor input to another device output to further devices comprising the overall micro-system).

One of the mechanical processes typically performed by MEMS is transporting small amounts of fluids through channels. These channels are frequently embedded in a covering layer (hereafter called: embedding layer). One of the difficulties in fabricating these microfluidic channels on, for example, a portion of a semiconductor is having fabricated the channel, fabricating an embedding layer over it that does not deposit into the channel, occlude the channel and prevent any fluid from flowing through it.

One method for successfully meeting this challenge is to fabricate the embedding layer over the area where the channel is to be placed, and then fabricating the channel. The embedding layer can be a global layer that covers the entire surface of the wafer, or it can be a local layer that covers only that part of the wafer where the channel is to go as well as a small area around the channel to provide the embedding layer support and attachment to the wafer.

One method of accomplishing this is to locally heat the embedded portion of the substrate (e.g. wafer) where the channel is to go in a reactive atmosphere. The reactive atmosphere combines with the heated substrate forming a gaseous reaction product that can be transported away from the channel in the vapor phase. The energy to heat the substrate locally in this embodiment would have to pass through the embedding layer. Therefore, the embedding layer will have to be transparent to the energy used to heat the substrate material to mill the channel. Another requirement of all such embodiments is that openings need to be available to provide for pathways for the exhaust of the reactant by-products. The engineering of such openings is also disclosed herewith.

One example of a microfluidic channel that may be used in MEMS is the electrokinetic pump. Electrokinetic pumps use an ionic fluid and a current imposed at one end of the channel and collected at the other end of the channel. This current in the ionic fluid impels the ionic fluid towards the collection pad of the electrokinetic pump.

One difficulty with milling the channel after the embedding layer has been deposited is that then the exposed surfaces of the embedded structure are made entirely of the substrate material. In one embodiment, the substrate can be silicon, as is the case wafers or in integrated circuit flip-chip packages. Exposed surfaces of silicon interact with any ionic fluid that is transported through them. The interaction can take the form of diffusion through the exposed silicon wall or an ionic pressure gradient between the ionic nature of the structure wall and the ionic nature of the fluid. Hence the need for a method for passivating the exposed surfaces, which is also an item disclosed herewith.

BRIEF DESCRIPTION OF THE DRAWINGS

The invention is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Reference will now be made to drawings wherein like structures will be provided with the like reference designations. In order to show the structures of the claims most clearly, the drawings included herein are diagrammatic representations of integrated circuit structures. Thus, the actual appearance of the fabricated structures, for example in a photomicrograph, may appear different while still incorporating essential structures of the claims. Moreover, the drawings show only the structures necessary to understand the claims. Additional structures known in the art have not been included to maintain the clarity of the drawings.

A method to passivate embedded microfluidic structures is disclosed herein. According to one embodiment, a microfluidic structure can be a channel through which an ionic fluid is intended to flow impelled by an electrokinetic pump.

In one embodiment, an energy transfer mechanism is used to transport energy through an embedding layer, the exposed walls of the embedded microfluidic structure directly. This means that the energy transfer mechanism is such that the embedding layer is transparent to it. Even if the embedding layer is not completely transparent, it will be substantially transparent and a great deal of the energy directed to the exposed embedded microfluidic structure surface will be received by the surface.

In the example of a silicon structure, the exposed embedded structure surface can be silicon and the embedding layer can be silicon oxide. One example of such a heat transfer mechanism may be but is not limited to exposing the substrate to laser radiation within the visible spectrum. Laser is an acronym for light amplification by stimulated emission of radiation. One result of this type of light generation is the light has a single frequency and phase. This visible laser light will be able to penetrate the embedding layer to strike the exposed embedded microfluidic structure surface causing that surface to heat up. In the example of a silicon microfluidic structure, the laser can locally heat the exposed silicon surface up to or just below the melting temperature of silicon.

When this embedded exposed silicon structure surface is heated in a reactive environment, the reactive gas in the atmosphere can form with the silicon structure that is heated to form a reaction product. When the reactive atmosphere is oxygen, a film of silicon dioxide can form on the exposed embedded microfluidic structure surfaces in the MEMS. When the reactive atmosphere is nitrogen, the reaction can form silicon nitride at the exposed embedded silicon surfaces of the structure. In the embodiment of a MEMS, the silicon nitride passivation surface can be as effective as the silicon dioxide passivation surface, depending on their thermal and optical characteristics.

Figure 1:
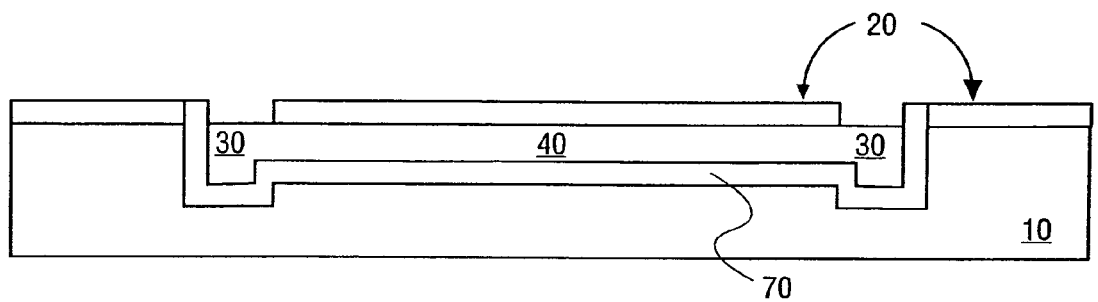
FIG. 1 is a cross-sectional schematic illustration of a MEMS microfluidic channel.

FIG. 1 is an illustration of one embodiment of the claimed apparatus. Embedding layer 20 which may be local or global on substrate 10 covers at least that part of the surface of substrate under which the buried channel is to be placed. Trenches 30 provides access from the surface of substrate to buried microfluidic channel 40. Buried microfluidic channel 40 traverses beneath embedding layer 20 from one access trench 30 to another. Buried microfluidic channel passivation layer 70 forms a passivating layer on all exposed surfaces in buried microfluidic channel 40 and trenches 30.

Figure 2A:
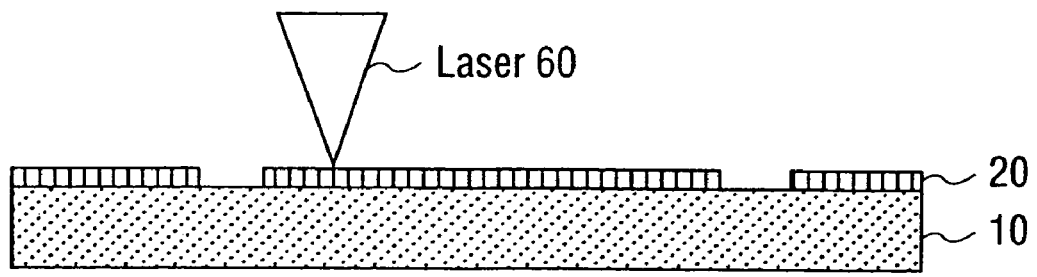
FIG. 2A is a cross-sectional schematic illustration of a substrate having an embedding layer formed over a surface with openings formed through the embedding layer.
Figure 2B:
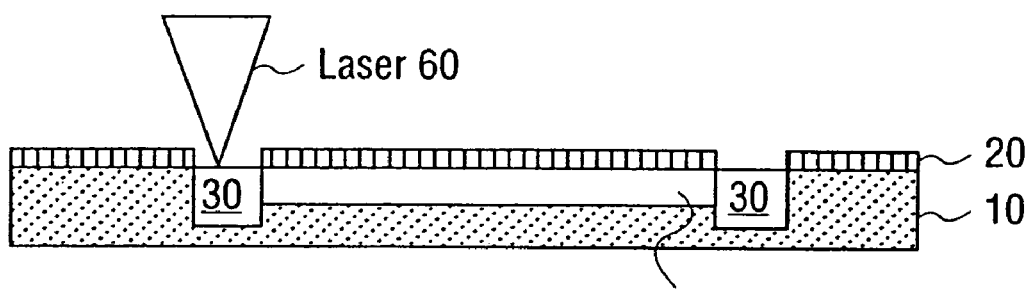
FIG. 2B is a cross-sectional schematic illustration of the structure of FIG. 2A after forming access trenches and a channel in the substrate beneath the embedding layer.
Figure 2C:
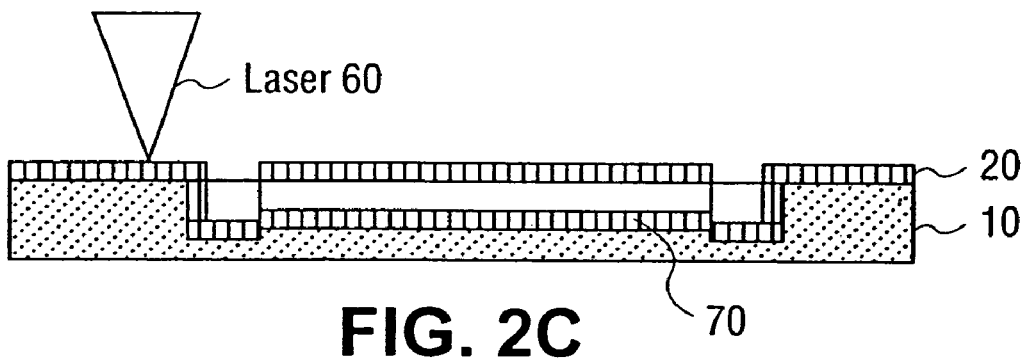
FIG. 2C is a cross-sectional schematic illustration of the structure of FIG. 2B after passivating the channel and access trenches.

FIGS. 2A-2C illustrate of one embodiment of a method of forming a microchannel in a substrate as a MEMS.

In FIG. 2A, an illustration of substrate 10 with an embedding layer 20 over it is presented. Substrate 10, in one embodiment, is a semiconductor material such as silicon and the embedding layer 20 is, for example, silicon dioxide. The silicon dioxide can be patterned to allow contact with substrate 10 in any of many ways. For standard channels, the silicon dioxide layer can be patterned with photolithography. In an example of a rapid prototyping system, the silicon dioxide can be patterned by ablating away with light from laser 60 selected portions of the silicon dioxide to make holes in the silicon dioxide that expose the surface of silicon substrate 10.

FIG. 2B shows the structure of FIG. 1 after milling an embedded channel into the MEMS structure beneath the embedding layer 20. Laser 60, focused at an exposed layer of silicon substrate 10, will locally heat the silicon up to and including the melting temperature of silicon. By focusing over the gaps in the silicon dioxide on the MEMS structure, the light from laser 60 can enable the milling of access trenches 30 well into silicon substrate 10. When substrate 10 is in a reactive atmosphere, such as an atmosphere including chlorine gas, the chlorine and the heated silicon can combine to make silicon tetrachloride, a gaseous reaction product. The silicon tetrachloride reaction product may be pumped out of the system.

When the light from laser 60 is focused at a part of the silicon substrate 10 that is beneath embedding layer 20, if the embedding layer is transparent to the laser light, the light will still strike substrate 10 beneath embedding layer 20. The silicon beneath embedding layer 20 will heat to near melting temperatures wherein it can react with the chlorine gas forming silicon tetrachloride, which is a gaseous reaction product. The silicon tetrachloride is then pumped away from the channel in formation and additional chlorine gas is diffused into the area, allowing continued reactions with the silicon. Buried microfluidic channel 40 may be rapidly drawn in this manner to connect trenches 30 beneath embedding layer 20.

The channel formation of FIG. 2B is possible because in this environment, the chlorine gas selectively etches silicon substrate 10. The preferential ratio of silicon to silicon dioxide in the chlorine reaction rate is at least approximately 1,000 times. So, the silicon dioxide etches about 1,000 times slower than silicon in this chlorine environment.

The ability of the laser light from laser 60 to locally heat and hence remove the silicon anywhere under embedding layer 20 is referred to as direct writing. Direct writing does not require the use of masks or aligners to define the geography of the channel being written. One advantage to direct writing the channel with a laser is the resulting direction and cross-section of the fabricated microfluidic channels can be varied as compared to chemically-etched microfluidic channels that are limited to shapes that follow crystallographic planes.

FIG. 2C shows the structure of FIG. 2B following channel formation. Given a microfluidic channel 40 in substrate 10 that is embedded in a layer of silicon dioxide wherein the access trenches 30 connect the embedded microfluidic channel 40 to the surface of the substrate, the exposed walls of embedded microfluidic channel 40 can be passivated in the same system by switching the reactive atmosphere from one of chlorine gas to one of oxygen gas. In the presence of heated silicon, oxygen gas in this system reacts with the exposed embedded microfluidic channel surfaces that are made of silicon to form silicon dioxide. The exposed surfaces of the silicon in microfluidic channel 40 are locally heated by rastering the beam of light from laser 60 while the embedding layer 20 made of silicon dioxide that is relatively transparent to the laser beam remains relatively cool. The laser beam can be rastered the entire length of microfluidic channel 40, heating all exposed silicon surfaces and covering them in a passivating layer. In another embodiment, this passivating layer can be made out of silicon nitride by substituting a nitrogen gas for the oxygen gas in the chamber.

Figure 3:
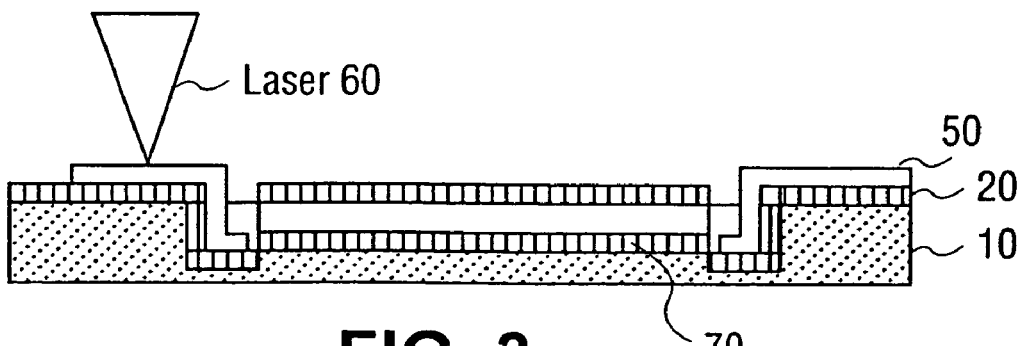
FIG. 3 is a cross-sectional schematic illustration of the structure of FIG. 2C after forming metal pads at the access trenches to form a microfluidic structure.

FIG. 3 shows the structure of FIG. 2C after supplying the atmosphere with yet another gas to form metal pads 50 on the outside of the microfluidic channel 40. In one example, a suitable gas is Platinum tetrakis trifluorophosphine to form metal pads 50 of platinum. As illustrated in FIG. 3, metal pads 50 reach into access trenches 30 of microfluidic channel 40, in this example, to form an electrokinetic pump to pump ionic fluids from one end of the channel to the other. Water, and water based ionic compounds and salt solutions, may be introduced into the microfluidic channel 40 as a suitable ionic fluid.

One advantage of the above techniques of forming a microfluidic channel that may function, for example, as a portion of an electrokinetic pump is in a properly equipped chamber; all of the above process steps to form the channel and the pump may be performed. In the example of a silicon substrate, with a back pressure in the chamber of oxygen gas, laser 60 may direct write a silicon dioxide insulation layer on the surface of substrate 10. This layer may be limited to covering only that area of substrate 10 where microfluidic channel 40 is to be placed, plus a small portion of substrate 10 surrounding microfluidic channel 40 to support and adhere the layer to the surface of substrate 10. The oxide would not be grown over the area where the trenches 30 are to be placed.

By removing the oxygen from the chamber, and replacing it with chlorine gas, the trenches 30 and buried microfluidic channel 40 may be fabricated beneath the embedding oxide layer. The chlorine gas can react with the heated silicon surface to dig trenches 30 down sufficiently to contact buried microfluidic channel 40. Focusing laser 60 on the silicon beneath the oxide will allow that silicon to react with the gas to form buried microfluidic channel 40. Replacing the chlorine gas with oxygen again will allow the formation of passivating oxide on the exposed surfaces of embedded silicon microfluidic channel 40. The locally heated silicon surface will react with the oxygen to form silicon dioxide. Finally, filling the chamber with a Platinum tetrakis trifluorophosphine gas will allow the formation of metal pads 50, both outside and inside the ends of the channel.

Figure 4:
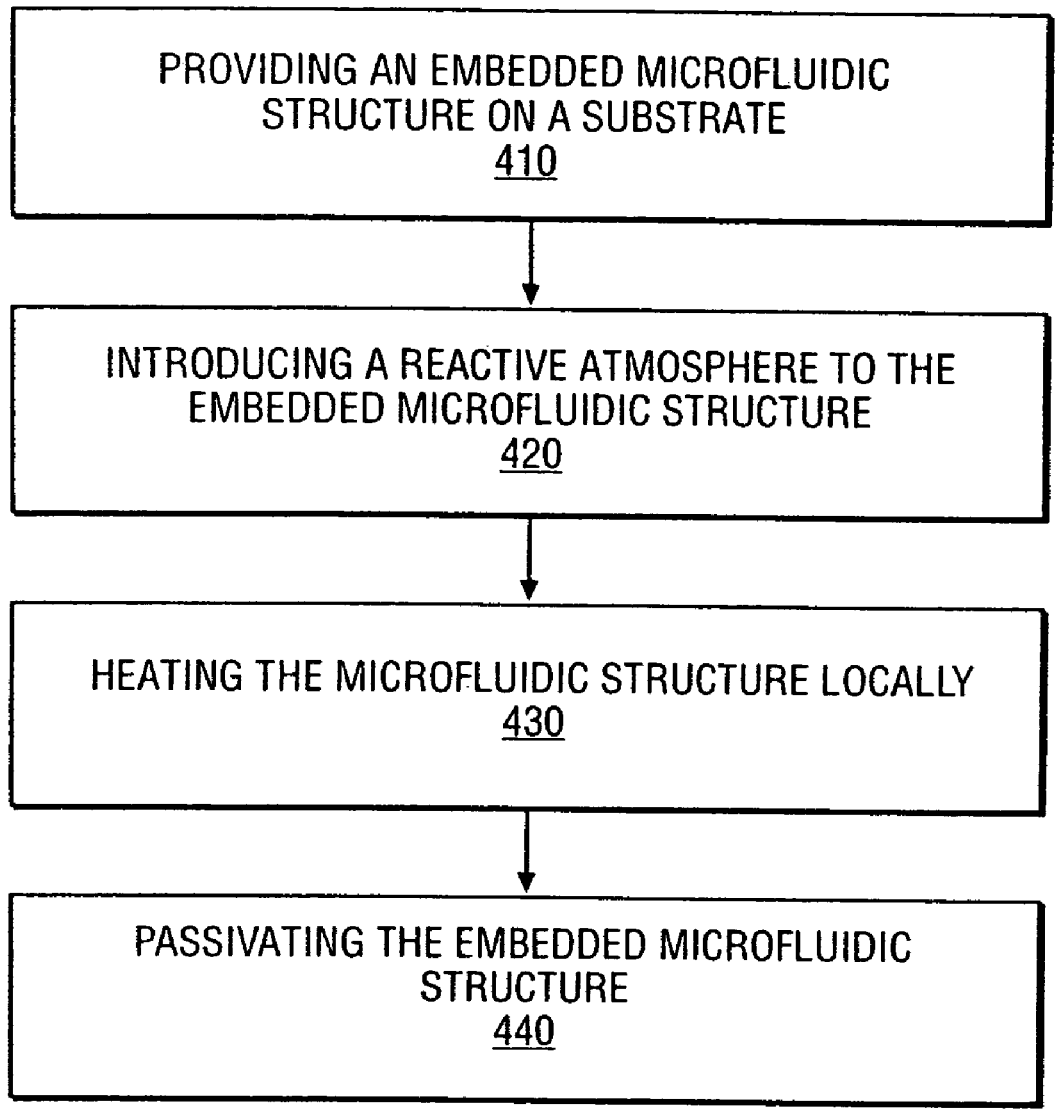
FIG. 4 is a flow diagram representing one method of fabricating one embodiment of a MEMS including a microfluidic structure.

FIG. 4 is a flow diagram representation of one method of the present invention. At block 410, an embedded microfluidic structure on a substrate is provided. The substrate can be silicon or any other material. A reactive atmosphere is introduced to the embedded microfluidic structure at block 420. This reactive atmosphere can be oxygen or nitrogen. The microfluidic structure is heated locally at block 430. This heating may be done by a laser. This laser would have a wavelength for which the embedding layer between the source of the laser and embedded microfluidic structure is substantially transparent. The laser, on microfluidic structure surface, generates heat. Heating the structure in the presence of a reactive gas causes a reaction to take place at the surface of the structure. In the case of oxygen, a silicon dioxide layer will be formed everywhere where there is exposed silicon. And, in the case of nitrogen, a silicon nitride passivation layer will be formed anywhere where there is exposed silicon. A reaction of the reactive gas and the heated silicon surface will passivate the embedded fluidic microfluidic structure as at block 240.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A microfluidic structure comprising:
   an embedded microfluidic channel beneath a silicon dioxide or silicon nitride embedding layer; wherein the silicon dioxide or silicon nitride embedding layer is an integral portion of the microfluidic structure;
   a passivation layer on a surface of the embedded microfluidic channel; wherein a surface of the passivation layer forms a continuous exposed surface of the embedded microfluidic channel;
   access trenches through the embedding layer at each end of the embedded microfluidic channel to enable access to the embedded microfluidic channel traversing beneath the embedding layer; and
   metal pads extending from within the bottom of the access trenches to above the embedding layer to form an electrokinetic pump configured to pump ionic fluid from one end of the microfluidic channel to the other end.

2. The apparatus of claim 1, wherein the embedding layer is a global layer.

3. The apparatus of claim 1, wherein the embedding layer is a local layer.

4. The apparatus of claim 1, wherein the passivation layer is formed in situ by locally heating the embedded microfluidic structure in a reactive atmosphere.

5. The apparatus of claim 1, wherein the embedding layer is sufficiently transparent to light from a laser source.

6. The apparatus of claim 1, wherein the passivation layer is formed on surfaces defining the access trenches.

7. A microfluidic structure comprising:
   a substrate having a silicon dioxide or silicon nitride embedding layer;
   an embedded microfluidic channel within the substrate beneath the embedding layer;
   a passivation layer on a surface of the embedded microfluidic channel; wherein a surface of the passivation layer forms a continuous exposed surface of the embedded microfluidic channel;
   access trenches formed in the substrate and embedding layer to enable access from above the embedding layer to the embedded microfluidic channel traversing beneath the embedding layer; and
   metal pads extending from within the bottom of the access trenches to above the embedding layer to form an electrokinetic pump configured to pump ionic fluid from one end of the microfluidic channel to the other end.

8. The apparatus of claim 7, wherein the embedding layer is a global layer.

9. The apparatus of claim 7, wherein the embedding layer is a local layer covering the embedded microfluidic channel.

10. The apparatus of claim 7, wherein the embedding layer is sufficiently transparent to light from a laser source.

11. The apparatus of claim 7, wherein the passivation layer is formed on surfaces defining the access trenches.

12. The apparatus of claim 7, wherein the passivation layer is formed in situ by locally heating the embedded microfluidic channel in a reactive atmosphere.

13. The microfluidic structure of claim 1, wherein the passivation layer comprises silicon dioxide or silicon nitride.

14. The microfluidic structure of claim 7, wherein the passivation layer comprises silicon dioxide or silicon nitride.

15. The microfluidic structure of claim 1, wherein the passivation layer is on all exposed surfaces of the passivated embedded microfluidic channel.

16. The microfluidic structure of claim 7, wherein the passivation layer is on all exposed surfaces of the passivated embedded microfluidic channel.

17. A microfluidic structure comprising:
   a substrate comprising a passivation layer on a surface of the substrate;
   a silicon dioxide or silicon nitride embedding layer;
   an embedded microfluidic channel between the passivation layer and the silicon dioxide or silicon nitride embedding layer; wherein the silicon dioxide or silicon nitride embedding layer is an integral portion of the microfluidic structure;
   access trenches through the embedding layer at each end of the embedded microfluidic channel to enable access to the embedded microfluidic channel traversing beneath the embedding layer; and
   metal pads extending from within the bottom of the access trenches to above the embedding layer to form an electrokinetic pump configured to pump ionic fluid from one end of the microfluidic channel to the other end.

18. A microfluidic structure of claim 1, wherein the microfluidic structure consists of two access trenches and the embedded microfluidic channel is buried beneath a silicon dioxide or silicon nitride embedding layer between the two access trenches.

19. A microfluidic structure of claim 7, wherein the microfluidic structure consists of two access trenches and the embedded microfluidic channel is buried beneath a silicon dioxide or silicon nitride embedding layer between the two access trenches.

20. A microfluidic structure of claim 17, wherein the microfluidic structure consists of two access trenches and the embedded microfluidic channel is buried beneath a silicon dioxide or silicon nitride embedding layer between the two access trenches.

* * * * *